United States Patent
Hata

Patent Number: 6,030,425
Date of Patent: Feb. 29, 2000

[54] CATALYTIC ACCELERATION AND ELECTRICAL BIAS CONTROL OF CMP PROCESSING

[75] Inventor: William Y. Hata, Milpitas, Calif.

[73] Assignee: LSI Logic Corporation, Milpitas, Calif.

[21] Appl. No.: 09/300,823

[22] Filed: Apr. 27, 1999

Related U.S. Application Data

[62] Division of application No. 08/652,905, May 23, 1996.

[51] Int. Cl.[7] .......................................... B24D 3/02
[52] U.S. Cl. ............................... 51/309; 252/79.1
[58] Field of Search ..................... 438/690, 691, 438/692; 451/259; 51/307, 308, 309; 252/79.1

[56] References Cited

U.S. PATENT DOCUMENTS

| | | | |
|---|---|---|---|
| 5,352,277 | 10/1994 | Sasaki | 106/6 |
| 5,922,091 | 7/1999 | Tsai et al. | 51/306 |
| 5,934,978 | 8/1999 | Burke et al. | 451/36 |

*Primary Examiner*—Benjamin Utech
*Assistant Examiner*—Kim-Chan Chen
*Attorney, Agent, or Firm*—Oppenheimer Wolff & Donnelly LLP

[57] ABSTRACT

A slurry for chemical-mechanical polishing comprises a high pH solution with particles of a catalyst mixed with the high pH solution for accelerating the polishing rate. The catalyst preferably is a metal selected from the group consisting of platinum, silver, palladium, copper, rhodium, nickel, and iron. The catalyst may be impregnated into a polishing pad used to apply the slurry to a surface. A CMP process for metal surfaces includes applying a slurry to a metal surface to be polished, and providing an electrical bias to the workpiece and to the slurry for controlling the polishing rate. The electrical bias is provided to dies in the workpiece by means of an electrical connection between a bias voltage source and scribe lines between adjacent dies.

1 Claim, 1 Drawing Sheet

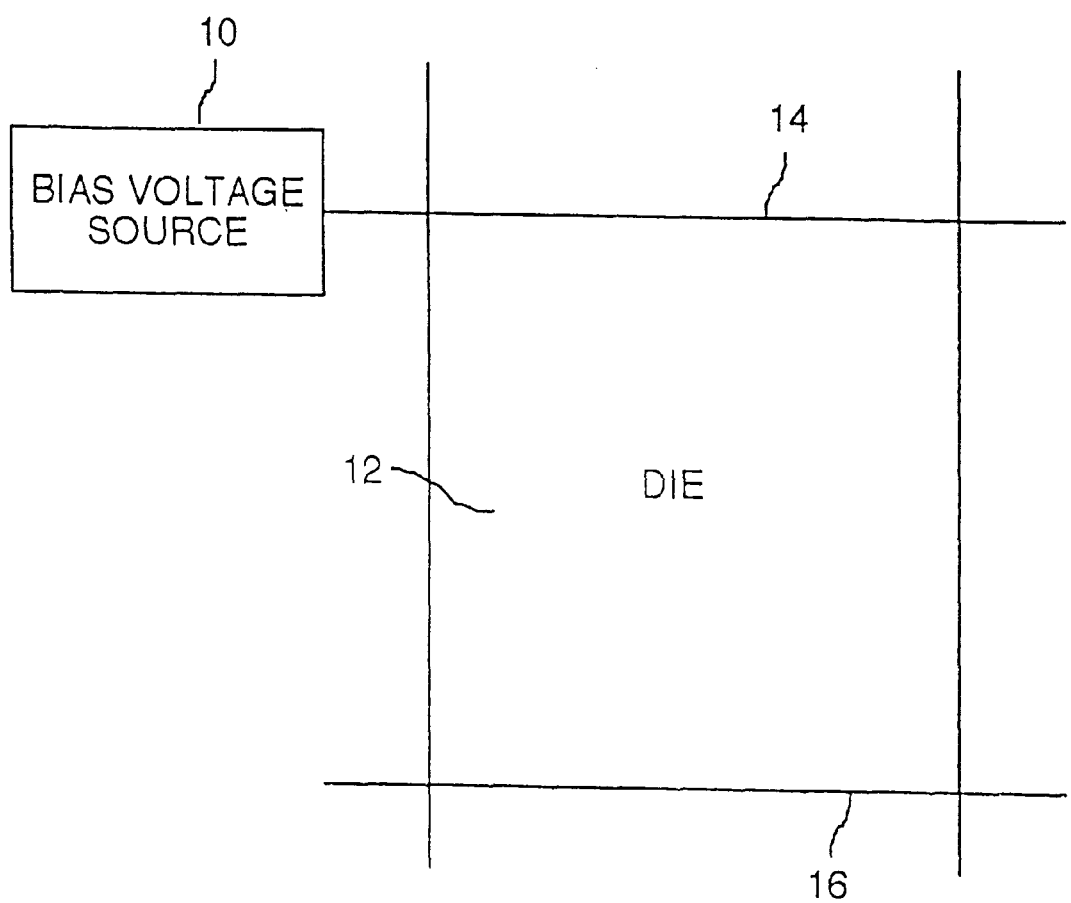

CATALYTIC ACCELERATION AND ELECTRICAL BIAS CONTROL OF CMP PROCESSING

CATALYTIC ACCELERATION AND ELECTRICAL BIAS CONTROL OF CMP PROCESSING

RELATED APPLICATIONS

This application is a divisional of U.S. patent application Ser. No. 08/652,905, filed May 23, 1996 pending Aug. 23, 1999.

BACKGROUND OF THE INVENTION

1. Field of the Invention

This invention relates generally to chemical-mechanical polishing in the processing of oxides and metals. This invention relates particularly to CMP processing of semiconductor wafers.

2. Description of the Related Art

Chemical Mechanical Polishing (CMP) is a chemical reaction accelerated by polishing action. It should be understood that CMP does not involve grinding or scraping physical ablation. CMP of oxides, particularly $SiO_2$, is generally accomplished with high pH solutions, such as an aqueous solution of potassium hydroxide, with colloidal suspensions of particles, such as $SiO_2$ or cesium oxides. The high pH solution is required to provide a strong lewis acid to hydrate the oxide. Even with the strong lewis acid, the reaction will not proceed at an appreciable reaction rate at room temperature. The activation energy is supplied by the polishing action. The colloidal particles deflect and strain the surface of the oxide in what is called the traveling Hertzian indenter.

The reaction rate and uniformity are controlled by various process parameters such as wafer rotation, downward pressure, curvature of wafer/backplane, polish table rotation, nape of polish pads, viscosity, maintenance of equipment and conditioning of pads. All of these items essentially affect surface reaction, boundary layer diffusion, and bulk diffusion.

The CMP process is difficult to control to the tolerances required for semiconductor manufacture. Even though the reaction rate is acceptably fast, large amounts of energy are required in CMP processing. Very large electrical motors are required to provide stable drives to the various disks and platens that are typically used in CMP processing. Satisfactorily balancing the reaction rates and diffusion rates, in particular, is very difficult. For example, a curved backplane is used to supply more downward pressure, i.e. activation energy, in the center of the wafer to balance the reduced linear travel of the rotating backplane and reduced diffusion rate in the center of the wafer.

CMP of metals is generally accomplished in low pH acids. The reaction of the acid with the metals is very fast. Therefore, the surface of the metal is oxidized to retard the reaction. Oxidation of the metal surface can be accomplished by adding an oxidant such as Hydrogen peroxide before removal of the oxidized metal by the CMP action. A colloidal suspension of particles deflects and strains the surface of the oxide to provide activation energy in the traveling Hertzian indenter.

Metals are often removed as part of a manufacturing flow called Damascene. In this process flow grooves or trenches are first formed in an insulating layer. A blanket coating of metal is applied to the trenches. Then the metal in all areas except the trenches is removed by CMP. This leaves lines of metal interconnect separated by insulators. One problem is the balance required to remove all excess metal in the insulating areas without gouging out the metal in the interconnect areas.

The rapid metal reaction must be balanced with the slower oxide reaction, the boundary diffusion of reactants and products, and the bulk diffusion of reactants.

SUMMARY OF THE INVENTION

The present invention provides a CMP technique that overcomes the difficulties with prior CMP techniques. In particular the present invention provides a technique that substantially reduces the activation energy required for CMP of oxides.

Reducing the activation energy provides several advantages. One advantage provided by the present invention is that rates of polishing are increased.

In addition the process according to the invention permits the use of lower pH solutions, which are safer and easier to handle and produce.

The process according to the invention allows the CMP reaction to be more controlled by physical properties, such as temperature, instead of mechanical tolerances, such as downward pressure.

The process according to the invention further provides better control of boundary layer diffusion by reducing the first order requirement of the traveling Hertzian indenter.

The CMP process according to the invention provides a reaction that is simpler and therefore easier to predict, model, and control.

A chemical-mechanical slurry polishing according to the invention comprises a high pH solution with particles of a catalyst mixed with the high pH solution for accelerating the polishing rate. The catalyst preferably is a metal selected from the group consisting of platinum, silver, palladium, copper, rhodium, nickel, and iron.

A chemical-mechanical polishing process according to the invention may also comprise the steps of providing a high pH solution and applying the solution to a workpiece to be polished with a polishing pad with at least a portion of the polishing pad being impregnated with particles of the catalyst for accelerating the polishing rate.

A chemical-mechanical polishing process may also comprise the steps of providing a slurry that includes a low pH acid solution to a metal surface to be polished, applying the solution to a workpiece to be polished and providing an electrical bias to the workpiece and to the slurry for controlling the polishing rate. The electrical bias is provided to dies in the workpiece by means of an electrical connection between a bias voltage source and scribe lines between adjacent dies.

Additional objects and advantages of the present invention are described in the following detailed description of a preferred embodiment of the invention, taken in conjunction with the drawings, which are briefly described below.

DESCRIPTION OF THE DRAWING

The FIGURE illustrates the application of an electrical bias to a semiconductor wafer during CMP metal processing.

DETAILED DESCRIPTION OF THE INVENTION

In CMP processing of oxides it has been found useful to use metals such as platinum, silver, palladium, copper, rhodium, nickel, or iron as catalysts for reducing the activation energy and increasing the reaction rate. There are various techniques that may be used to obtain the benefit of the catalytic effects of these metals.

The metals may be powdered and placed in a slurry used in CMP processing. The metal catalyst may alternatively be impregnated onto the polishing pad or impregnated into the polish particles. Particles of the metal catalyst may further be used as the polish particles. Still another technique for using the metal catalyst is to form it into strips or other suitable geometric configurations for attachment to the polishing pad.

This above-described process is not limited to semiconductor manufacturing. It can be used on any CMP processing of oxides. Another use for the CMP process according to the invention is in polishing of optical lenses. Typically the manufacture of optical lenses includes both grinding and CMP polishing.

The invention also may also include CMP polishing of metals that are used to form electrical connections in integrated circuits. Typical metallization processes include polishing the outer surface of the metal after it has been deposited on a semiconductor chip.

Referring to the Figure, an electrical bias source 10 is connected to the front side of a semiconductor wafer 12 during metal CMP processing. Because the CMP solution is electrically conductive, the electrical bias provided by bias source 10 the can be used to either accelerate or retard the reaction rate.

The electrical bias can be applied through either front side contact or by backside contact through the wafer 12. Topside electrical contact may be made in the bulk area of the metal to be removed. This topside electrical contact may be accomplished using a metal finger on the front of the wafer.

Another implementation of the contact is to form a net or array in the scribelines 14 and edge 16 of the wafer 12 to make the contact more uniformly over the wafer 12. Then the contact may be made at the edge of the wafer 12 or through a special via to the back. The contact is then biased to accelerate the reaction.

If the reaction is very fast using the electrical bias then the overall reactivity of the process without bias can be reduced. For example, pH of the CMP slurry could be increased, the downward pressure could be reduced or rotation rates could be reduced. This way the large expanses of open area to be removed can be removed quickly. Because the electrical contact is broken, the rate will be reduced to a much slower and easier to control non-biased process.

The electrical contact to the interconnect lines may be made through backside contact by biasing the substrate. In this case a bias is applied to retard the reaction. It is difficult to design a circuit such that all metal lines are accessible by backside contact. However, this can be done for a few lines. In particular, this would be useful in wide lines such as ground and power rings. These rings need to be wide to conduct the large amount of active current. However, when the rings are wide, there is a tendency to etch more in the middle of the wide space. In other words, the metal is thin in the middle. Electrical retardation of this line could reduce the effect.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

I claim:

1. A chemical-mechanical polishing slurry, comprising:

a high pH solution;

and particles of a catalyst mixed with the high pH solution for accelerating the polishing rate, wherein the catalyst is selected from the group consisting of platinum, silver, palladium, copper, rhodium, nickel, and iron.

* * * * *